(12) United States Patent
Seki et al.

(10) Patent No.: US 9,404,638 B2
(45) Date of Patent: Aug. 2, 2016

(54) OPTICAL ELEMENT AND ILLUMINATION UNIT

(71) Applicant: NALUX CO., LTD., Osaka-shi, Osaka (JP)

(72) Inventors: Daisuke Seki, Osaka (JP); Katsumoto Ikeda, Osaka (JP)

(73) Assignee: NALUX CO., LTD., Osaka-Shi, Osaka (JP)

( * ) Notice: Subject to any disclaimer, the term of this patent is extended or adjusted under 35 U.S.C. 154(b) by 45 days.

(21) Appl. No.: 14/034,600

(22) Filed: Sep. 24, 2013

(65) Prior Publication Data

US 2014/0063816 A1 Mar. 6, 2014

Related U.S. Application Data

(63) Continuation of application No. PCT/JP2011/068161, filed on Aug. 9, 2011.

(60) Provisional application No. 61/467,552, filed on Mar. 25, 2011.

(51) Int. Cl.
*F21V 13/04* (2006.01)
*F21V 5/04* (2006.01)
*F21V 7/00* (2006.01)
(Continued)

(52) U.S. Cl.
CPC . *F21V 13/04* (2013.01); *F21V 5/04* (2013.01); *F21V 5/046* (2013.01); *F21V 7/0091* (2013.01); *F21Y 2101/02* (2013.01); *H01L 33/58* (2013.01)

(58) Field of Classification Search
CPC ......... F21V 5/046; F21V 5/04; G02B 6/0061; G02B 19/0028

USPC .......................................................... 362/329
See application file for complete search history.

(56) References Cited

U.S. PATENT DOCUMENTS 7,319,244 B2 * 1/2008 Liu et al. .......................... 257/98
7,566,148 B2 * 7/2009 Noh ........................ H01L 33/54
362/305

(Continued)

FOREIGN PATENT DOCUMENTS

EP 1376708 A2 6/2003
EP 1486818 A2 12/2004
(Continued)

OTHER PUBLICATIONS

International Search Report dated Oct. 18, 2011 corresponding to International Patent Application No. PCT/JP2011/068161 and English translation thereof.

*Primary Examiner* — Anh Mai
*Assistant Examiner* — Zachary J Snyder
(74) *Attorney, Agent, or Firm* — Squire Patton Boggs (US) LLP

(57) ABSTRACT

An optical element according to the present invention includes a light receiving surface which is designed to cover an emitting surface of a planar light source device, a reflecting surface, a light exit surface which is contiguous to the periphery of the reflecting surface. When the center of the emitting surface is designated as a point O and an axis which passes through the point O and is perpendicular to the emitting surface is designated as an optical axis of the optical element, the reflecting surface has a concave portion around the optical axis and an outer edge surrounding the concave portion.

7 Claims, 11 Drawing Sheets

(51) Int. Cl.
*F21Y 101/02* (2006.01)
*H01L 33/58* (2010.01)

(56) References Cited

U.S. PATENT DOCUMENTS

| | | | |
|---|---|---|---|
| 7,602,559 B2 | 10/2009 | Jang et al. | |
| 8,142,056 B2 * | 3/2012 | Li | F21V 7/0091 362/308 |
| 2003/0235050 A1 | 12/2003 | West et al. | |
| 2004/0233665 A1 | 11/2004 | West et al. | |
| 2006/0067640 A1 * | 3/2006 | Hsieh | F21V 7/0091 385/146 |
| 2006/0076571 A1 | 4/2006 | Hsieh et al. | |
| 2006/0083003 A1 * | 4/2006 | Kim et al. | 362/327 |
| 2006/0208267 A1 * | 9/2006 | Chin | H01L 33/58 257/98 |
| 2006/0238884 A1 * | 10/2006 | Jang | F21V 5/04 359/653 |
| 2007/0273984 A1 * | 11/2007 | Pao | G02B 19/0071 359/726 |
| 2008/0089062 A1 * | 4/2008 | Vennetier | G02B 19/0066 362/241 |
| 2008/0100773 A1 * | 5/2008 | Hwang | G02B 3/005 349/62 |
| 2008/0151551 A1 * | 6/2008 | Yang | F21V 5/046 362/308 |
| 2008/0259630 A1 * | 10/2008 | Chinniah | F21V 7/0091 362/551 |
| 2009/0129097 A1 * | 5/2009 | Ewert | B29C 45/0025 362/328 |
| 2009/0196047 A1 * | 8/2009 | Chinniah | F21V 5/046 362/297 |
| 2011/0222294 A1 * | 9/2011 | Fan | F21V 5/04 362/296.01 |

FOREIGN PATENT DOCUMENTS

| | | |
|---|---|---|
| EP | 1717627 A1 | 11/2006 |
| JP | 2003-158302 A | 5/2003 |
| JP | 2004-133391 A | 4/2004 |
| JP | 2004-349251 A | 12/2004 |
| JP | 2006-099117 A | 4/2006 |
| JP | 2006-309242 A | 11/2006 |
| JP | 2007-048883 A | 2/2007 |
| JP | 2007-208141 A | 8/2007 |
| JP | 2008-053660 A | 3/2008 |
| JP | 2010-097088 A | 4/2010 |

* cited by examiner

X-AXIS

X-AXIS

UNEVENNESS OF ILLUMINANCE
IN THE FORM OF A RING

OPTICAL ELEMENT AND ILLUMINATION UNIT

CROSS REFERENCE TO RELATED APPLICATIONS

This application is a continuation of International Patent Application No. PCT/JP2011/068161 filed Aug. 9, 2011 which claims priority from U.S. Provisional Patent Application No. 61/467,552 filed Mar. 25, 2011. The contents of this application is hereby incorporated by reference.

TECHNICAL FIELD

The present invention relates to an optical element for an illumination unit and an illumination unit.

BACKGROUND ART

Light emitting diodes (LED) are used as light sources for a large-size illumination unit such as that used for backlight of TV sets. Slimness and evenness of illuminance are required for such an illumination unit.

FIG. 1 shows an example of a structure of an illumination unit using LEDs used for backlight. The illumination unit includes LED light sources 200, optical elements 100, a reflecting plate 300 and a diffusion plate 400. Each of the LED light sources 200 are covered by one of the optical elements 100. The optical elements 100, each covering each of the LED light sources 200, are arranged at regular intervals on the reflecting plate 300. The diffusion plate 400 is provided above the reflecting plate 300 and the optical elements 100.

Lights emitted by the LED light sources 200 are reflected by the optical elements 100 toward the rear (in the direction toward the reflecting plate 300). Then the lights reflected toward the rear are further reflected by the reflecting plate 300, diffused by the diffusion plate 400 and reach a plane to be illuminated. Thus, evenness of illuminance on the plane to be illuminated is realized. Various types of illumination units using reflecting plates and diffusion plates such as those described above have been developed (Patent Documents 1 to 3). The planar light emitting device described in Patent Document 1 is not of a structure in which optical elements contain light sources, and therefore a sufficient slimness of the illumination device cannot be realized. On the other hand, in the optical element of lateral light-emitting type described in Patent Document 2, in which a light source chip is imbedded in the center of a lens and in the lens of lateral light-emitting type described in Patent Document 3, which is provided with a concave portion for arranging a light source in the light receiving side, a part of lights is directed directly from the sides of the lens to a plane to be illuminated without being reflected by the lens. As a result, unevenness of illuminance is generated on the plane to be illuminated in such a way that outlines of the lenses appear at the positions on the plane, which correspond to the lenses.

Thus, an optical element for an illumination unit and an illumination unit which are capable of realizing both slimness and a high evenness of illuminance on a plane to be illuminated, have not been developed.

PATENT DOCUMENTS

Patent Document 1: JP2007-048883A
Patent Document 2: JP2003-158302A
Patent Document 3: JP2006-309242A Accordingly, there is a need for an optical element for an illumination unit and an illumination unit which are capable of realizing both slimness and a high evenness of illuminance on a plane to be illuminated.

SUMMARY OF INVENTION

An optical element according to a first aspect of the present invention includes a light receiving surface which is designed to cover an emitting surface of a planar light source device, a reflecting surface which is arranged opposed to the light receiving surface, a light exit surface which is contiguous to the periphery of the reflecting surface. When the center of the emitting surface is designated as a point O and an axis which passes through the point O and is perpendicular to the emitting surface is designated as an optical axis of the optical element, the reflecting surface has a concave portion around the optical axis and an outer edge surrounding the concave portion. In any cross section of the optical element, which contains the optical axis and is perpendicular to the emitting surface, lights emitted from the point O are reflected on an area of 80% or more of the reflecting surface, and when an inclination angle which a normal to the light receiving surface at a point P forms with a first plane which contains the emitting surface is designated as θp, the point P being a point of intersection of the light receiving surface with the first plane, an inclination angle which a line connecting the point P and a point of intersection of the reflecting surface with the light exit surface forms with the first plane is designated as ω and refractive index of a material of the optical element is designated as n, inclination of the light receiving surface with respect to the first plane is determined so as to satisfy the following expressions.

$$\tan\theta_p > \frac{n\sin\omega}{n\cos\omega - 1} \quad (1)$$

$$\cos\omega > \frac{1}{n} \quad (2)$$

In the optical element according to the present aspect, lights which have been emitted and travel along the emitting surface of the planar light source device are not made to exit directly from the light exit surface without being reflected on the reflecting surface. Accordingly, the problem that unevenness of illuminance is generated on a plane to be illuminated in such a way that outlines of the lenses (optical elements) appear at the positions on the plane, which correspond to the lenses, can be resolved and an illumination unit in which slimness and a high evenness of illuminance is realized can be obtained.

An optical element according to a first embodiment of the present invention is the optical element according to the first aspect and inclination of the light receiving surface with respect to the first plane is further determined so as to satisfy the following expression.

$$2.0 \cdot \left(\frac{n\sin\omega}{n\cos\omega - 1}\right) > \tan\theta_p > \frac{n\sin\omega}{n\cos\omega - 1} \quad (3)$$

According to the present embodiment, unevenness of illuminance can be eliminated with a small optical element. Accordingly, with the small optical element, an illumination unit in which slimness and a high evenness of illuminance is realized can be obtained.

An optical element according to a second embodiment of the present invention is the optical element according to the first aspect and in any cross section of the optical element, which contains the optical axis and is perpendicular to the emitting surface, when a point of intersection of a line which passes through the point O and forms an inclination angle of α with respect to the first plane, with the light receiving surface is designated as a point Q and an inclination angle of a normal to the light receiving surface at the point Q with respect to the first plane is designated as θ, inclination of the light receiving surface with respect to the first plane is determined so as to satisfy the following expression in a range of $$\tan\alpha < 0.2. \quad (4)$$
$$\tan\theta > \frac{n\sin\omega - \sin\alpha}{n\cos\omega - \cos\alpha}$$

In the optical element according to the present embodiment, lights which are emitted from the point O at small angles α with respect to the emitting surface of the planar light source device, α satisfying $$\tan\alpha < 0.2,$$

are not made to exit directly from the light exit surface without being reflected on the reflecting surface. Accordingly, the problem that unevenness of illuminance is generated on a plane to be illuminated in such a way that outlines of the lenses (optical elements) appear at the positions on the plane, which correspond to the lenses, can be resolved and an illumination unit in which slimness and a high evenness of illuminance is realized can be obtained.

An optical element according to a third embodiment of the present invention is the optical element according to the second embodiment and inclination of the light receiving surface with respect to the first plane is determined so as to satisfy the following expression in a range of $$\tan\alpha < 0.2. \quad (5)$$
$$2.0 \cdot \left(\frac{n\sin\omega - \sin\alpha}{n\cos\omega - \cos\alpha}\right) > \tan\theta > \frac{n\sin\omega - \sin\alpha}{n\cos\omega - \cos\alpha}$$

According to the present embodiment, unevenness of illuminance can be eliminated with a small optical element. Accordingly, with the small optical element, an illumination unit in which slimness and a high evenness of illuminance is realized can be obtained.

An optical element according to a fourth embodiment of the present invention is the optical element according to the first aspect and the light exit surface is constructed such that distance from the optical axis increases with distance from the first surface and in any cross section of the optical element, which contains the optical axis and is perpendicular to the emitting surface, the light exit surface is represented as a curve which is curved inward.

According to the present embodiment, rays which exit from the light exit surface can be made to reach more distant points and therefore evenness of illuminance can be further enhanced.

An optical element according to a fifth embodiment of the present invention is the optical element according to the first aspect and includes a reflection member in an area containing a point of intersection of the reflecting surface with the optical axis.

According to the present embodiment, rays which are emitted by the planar light source device and made to exit directly from the area around the optical axis on the reflecting surface can be eliminated by the reflection member. Accordingly, an illumination unit with a higher evenness of illuminance can be realized. The reflection member includes a reflective paint and a metal film.

An illumination unit according to a second aspect of the present invention includes a planar light source device and the optical element according to the first aspect used for the planar light source device, wherein the unit is constructed such that lights which exit from the light exit surface of the optical element are reflected toward the front.

The illumination unit according to the present aspect uses the optical element according to the first aspect, and therefore slimness and a high evenness of illuminance ca be realized.

DESCRIPTION OF EMBODIMENTS

Figure 2:
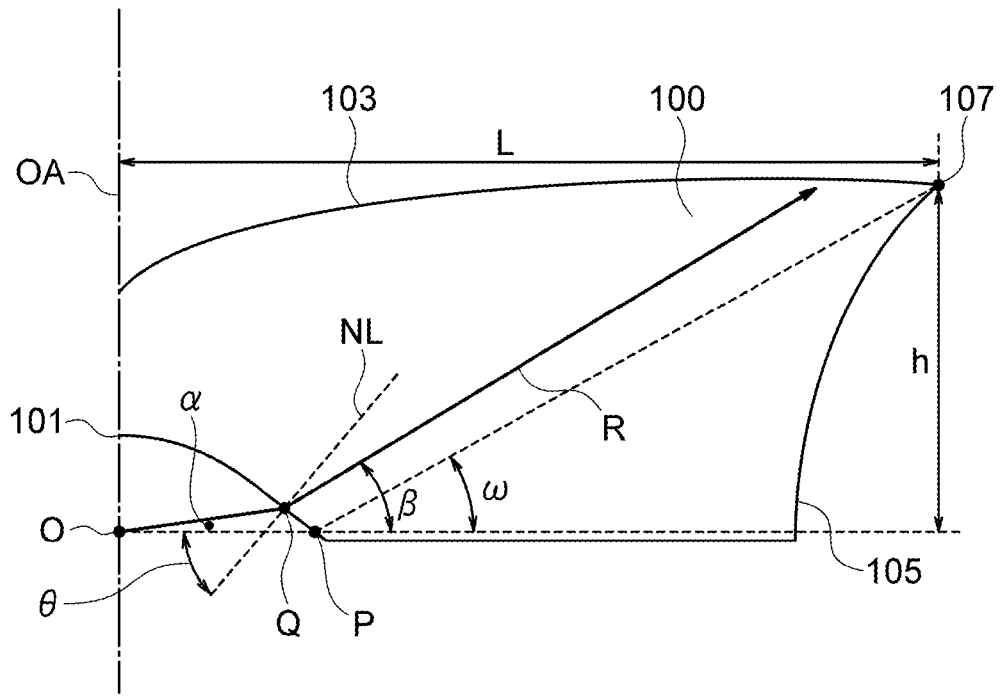
FIG. 2 illustrates a structure of a lens of lateral light-emitting type.

FIG. 2 illustrates a structure of a lens 100 of lateral light-emitting type. The lens 100 is so arranged as to cover a planar light source device 200 such as LEDs, not shown in FIG. 2.

The center of the emitting surface of the planar light source device 200 is designated as a point O. The axis which passes through the point O and is perpendicular to the emitting surface of the planar light source device 200 is designated as an optical axis OA. FIG. 2 shows a cross section of the lens 100, which contains the optical axis OA. The lens 100 is provided with a light receiving surface 101, a reflecting surface 103 and a light exit surface 105. The boundary between the reflecting surface 103 and the light exit surface 105 is referred to as an edge 107. Rays emitted from the point O are refracted when passing through the light receiving surface 101, reflected on the reflecting surface 103 and exit from the light exit surface 105. In FIG. 2, an angle which ray R emitted from the point O forms with the emitting surface of the planar light source device 200 (which is in the horizontal direction in FIG. 2) is represented as α while an angle which the ray which has been refracted at the light receiving surface 101 forms with the emitting surface is represented as β. Further, the point of intersection of the ray emitted from the point O with the light receiving surface 101 is represented as a point Q.

The reflecting surface 103 are arranged opposed to the light receiving surface 101. The reflecting surface 103 has a concave portion around the optical axis OA and an outer edge surrounding the concave portion, and is constructed such that 80% or more of the surface area reflects lights emitted from the point O. "80% or more of the surface area" means 80% or more of an area which is formed by projecting the reflecting surface 103 onto the emitting surface. Further, "80% or more of the surface area" is intended to exclude an exceptional area such as an area around an unusual point including the point of intersection of the optical axis with the reflecting surface and an area which rays are allowed to pass through, which will be described later. In general, when a shape of the reflecting surface in a cross section containing the optical axis is made to be a curve which is appropriately curved upward, lights from the light source device can undergo total reflection at almost whole area of the reflecting surface. Alternatively, a portion of the reflecting surface 103, particularly the portion around the optical axis, can be made to undergo aluminum evaporation to reflect lights which have reached the portion.

Figure 1:
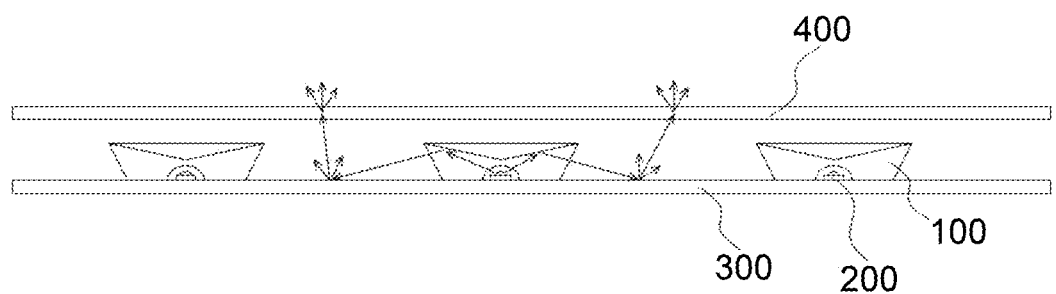
FIG. 1 shows an example of structure of an illumination unit for backlight, using LEDs.

When a distance L between the optical axis OA and the edge 107 is reduced in order to downsize the lens, rays emitted from the point O at small angles α are refracted when passing through the light receiving surface 101 and directly exit from the light exit surface 105 without being reflected on the reflecting surface 103. The rays which directly exit from the light exit surface 105 are directed to the diffusion plate 400 without being reflected on the reflecting plate of the illumination unit shown in FIG. 1. The inventors of the present application have made findings that such rays emitted from the point O at small angles α cause unevenness of illuminance on the plane to be illuminated. Accordingly, in order to obtain a high evenness of illuminance on the plane to be illuminated, in the rays emitted from the point O at small angles α, those which directly exit from the light exit surface 105 without being reflected on the reflecting surface 103 of the lens must be minimized. The inventors of the present application have made the present invention by studying how to eliminate rays which directly exit from the light exit surface 105 without being reflected on the reflecting surface 103 of the lens in the rays emitted from the point O at small angles α.

Figure 3:
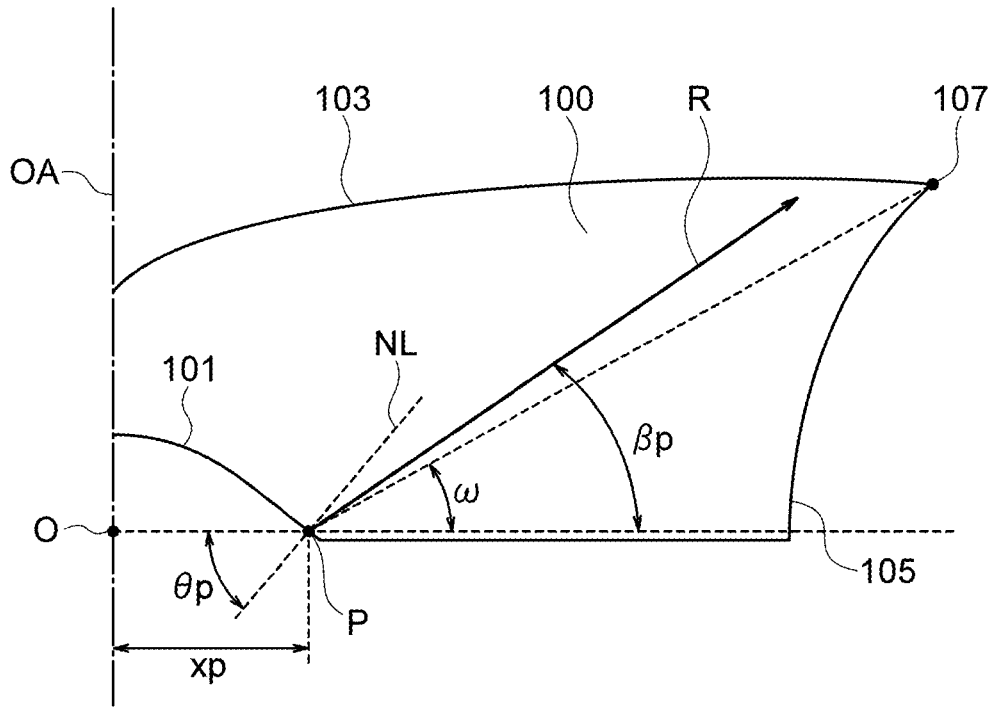
FIG. 3 illustrates an optical element according to the present invention.

FIG. 3 illustrates an optical element according to the present invention. In order to eliminate rays which directly exit from the light exit surface 105 without being reflected on the reflecting surface 103 of the lens, the lens 100 should be constructed such that a ray emitted from the point O in the horizontal direction is refracted at a point P, which is a point of intersection of the ray with the light receiving surface 101, and then travels on the side of the optical axis OA with respect to the line connection the point P and the point representing the edge 107. More specifically, when refractive index of a material of the lens 100 is designated as n, an angle which the normal to the light receiving surface 101 at the point P forms with the direction of the incident ray (the horizontal direction) is designated as θp, an angle which the line connection the point P and the point representing the edge 107 forms with the horizontal direction is designated as ω and an angle which the ray R which has been refracted at the light receiving surface 101 forms with the horizontal direction is designated as βp, the light receiving surface 101 should be so designed as to satisfy the following expression.

$$\beta_p = \theta_p - \sin^{-1}\left(\frac{\sin\theta_p}{n}\right) > \omega$$

The above-described expression can be transformed into the following expressions.

$$n\sin(\theta_p - \omega) > \sin\theta_p \tag{1}$$

$$\tan\theta_p > \frac{n\sin\omega}{n\cos\omega - 1}$$

At the same time, the outer diameter of the lens must be increased so as to satisfy the following expression. The expression represents the condition that there exists a shape of the light receiving surface which eliminates rays which directly exit from the light exit surface 105.

$$\cos\omega > \frac{1}{n} \tag{2}$$

When the angle θp is reduced, a distance xp between the point O and the point P increases, and therefore a distance L between the optical axis OA and the edge 107 must be increased to satisfy the expression (2). As a result, the lens must be upsized, and the producing costs increase. Accordingly, in order to eliminate unevenness of illuminance without upsizing the lens, θp should preferably be so set as to satisfy the following condition.

$$2.0 \cdot \left(\frac{n\sin\omega}{n\cos\omega - 1}\right) > \tan\theta_p > \frac{n\sin\omega}{n\cos\omega - 1} \tag{3}$$

In order to consider a shape of the light receiving surface 101 besides that at the point P, the condition that a ray emitted from the point O at angle α with respect to the horizontal direction directly exits from the light exit surface 105 without being reflected on the reflecting surface 103 will be studied. A point of intersection of the ray with the light receiving surface 101 is represented as a point Q. An angle which the ray which has entered the light receiving surface 101 at the point Q and has been refracted forms with the horizontal direction is designated as β. In order that a ray R, which has entered the light receiving surface 101 at the point Q and has been refracted, should be reflected on the reflecting surface 103 and then made to exit from the light exit surface 105, it is enough to make the ray travel on the side of the optical axis with respect to the line connecting the point P and the point representing the edge 107. Accordingly, when an angle which the normal to the light receiving surface 101 at the point Q forms with the horizontal direction is designated as θ, and an angle which the line connecting the point P and the point representing the edge 107 forms with the horizontal direction is ω, the following conditions should be satisfied.

$$\beta = \theta - \sin^{-1}\left\{\frac{\sin(\theta - \alpha)}{n}\right\} > \omega \quad (4)$$

$$\tan\theta > \frac{n\sin\omega - \sin\alpha}{n\cos\omega - \cos\alpha}$$

$$\theta > \theta_{min} = \tan^{-1}\left(\frac{n\sin\omega - \sin\alpha}{n\cos\omega - \cos\alpha}\right)$$

θ min represents the minimum value of angle θ.

Figure 4:
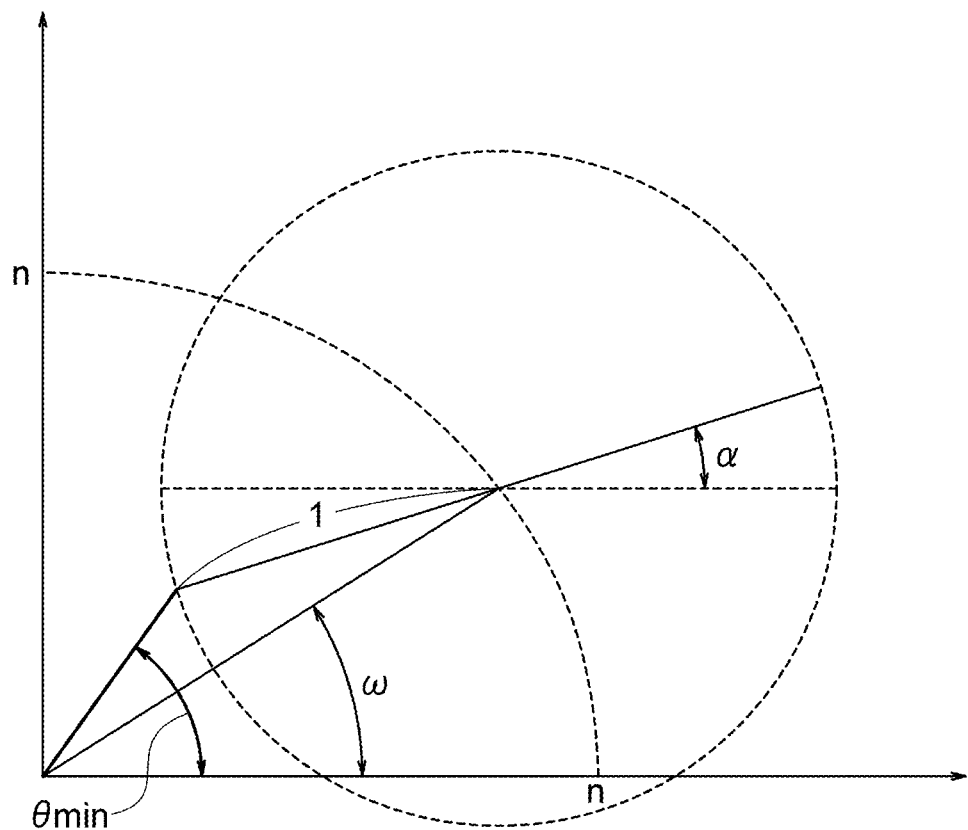
FIG. 4 shows a relationship between angle α and angle θ min.

FIG. 4 shows a relationship between angle θ min and angle α. In FIG. 4, as angle α decreases, angle θ min increases. This means that as a portion of the light receiving surface 101 becomes closer to the horizontal plane containing the emitting surface, inclination with respect to the horizontal direction of the portion of the light receiving surface 101 must be reduced.

In order to eliminate unevenness of illuminance without upsizing the lens, angle θ should be so set as to satisfy the following condition corresponding to the condition represented by Expression (3).

$$2.0 \cdot \left(\frac{n\sin\omega - \sin\alpha}{n\cos\omega - \cos\alpha}\right) > \tan\theta > \frac{n\sin\omega - \sin\alpha}{n\cos\omega - \cos\alpha} \quad (5)$$

Thus, according to the present invention, rays emitted from the point O at small angles α can be prevented from exiting from the light exit surface 105 without being reflected on the reflecting surface 103. On the other hand, when the light exit surface is constructed such that a distance from the optical axis increases with a distance from the plane containing the emitting surface, that is, the light exit surface is inclined toward the outside in a lens in which rays emitted from the point O at small angles α exit directly from the light exit surface, some of the rays which have entered the light exit surface are reflected in the direction which is substantially perpendicular to the emitting surface so that very apparent unevenness of illuminance in the form of rings is generated on the plane to be illuminated. Accordingly, in a lens in which rays emitted from the point O at small angles α exit directly from the light exit surface, the light exit surface cannot be largely inclined toward the outside. In contrast to this, in the lens according to the embodiment of the present invention, rays emitted from the point O at small angles α do not exit from the light exit surface 105 without being reflected on the reflecting surface 103, and therefore the light exit surface can be inclined toward the outside. Accordingly, in the lens according to the embodiment of the present invention, by forming the lens such that the light exit surface is inclined toward the outside and is curved inward, emitted rays can be made to reach distant points so that evenness of illuminance can be further enhanced.

Examples and comparative examples of the present invention will be described below. The lenses used in the examples and comparative examples are made of acrylic. Refractive index of the lenses is 1.49 for d line.

Figure 5:
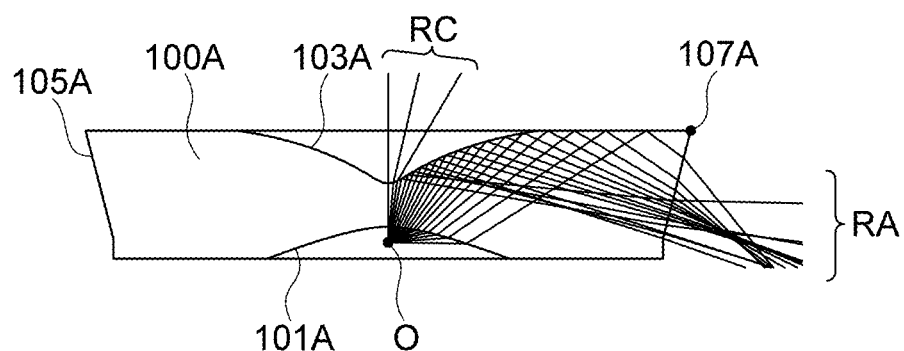
FIG. 5 shows optical paths of rays through a lens of Example 1 of the present invention.

FIG. 5 shows optical paths of rays through a lens 100A of Example 1 of the present invention. A light receiving surface 101A of the lens 100A is shaped like a dome, the top of which is located at a point of intersection with the optical axis. A reflecting surface 103A is shaped as a concave portion, the bottom of which is located at a point of intersection with the optical axis. The reflecting surface 103A is represented as a curve which is curved upward in a cross section containing the optical axis. A light exit surface 105A is inclined toward the outside.

In a coordinate system in which the point O is set to the origin and the optical axis is set to Z-axis, the light receiving surface 101A and the reflecting surface 103A can be represented by the following expression when a distance from the Z-axis is designated as r.

$$Z = \frac{cr^2}{1 + \sqrt{1 - (1+k)c^2r^2}} + \sum_{n=0} A_n \cdot r^n \quad (6)$$

Table 1 shows coefficients of Expression (6). In Table 1, "E-03" represents $10^{-3}$.

TABLE 1

| Coefficient | Light receiving surface 101A | Reflecting surface 103A |
|---|---|---|
| C | −0.200 | 0.000 |
| K | −7.000 | 0.000 |
| A0 | 0.600 | 2.100 |
| A1 | 0.000 | 0.600 |
| A2 | 0.000 | −0.055 |
| A3 | 0.000 | 1.45E−03 |
| A4 | 0.000 | 0.000 |

A light exit surface 105A is of cone, a diameter of which is 10.0 at z=0.1 and 11.0 at z=4.0.

In FIG. 5, RA represents rays which are emitted from the point O, reflected by the reflecting surface 103A and made to exit from the light exit surface 105A. RC represents rays around the optical axis which are emitted from the point O at large angles α and made to exit from the reflecting surface 103A. Rays which are emitted from the point O at small angles α and made to exit directly from the light exit surface 105A without being reflected on the reflecting surface 103A do not exist.

Figure 10:
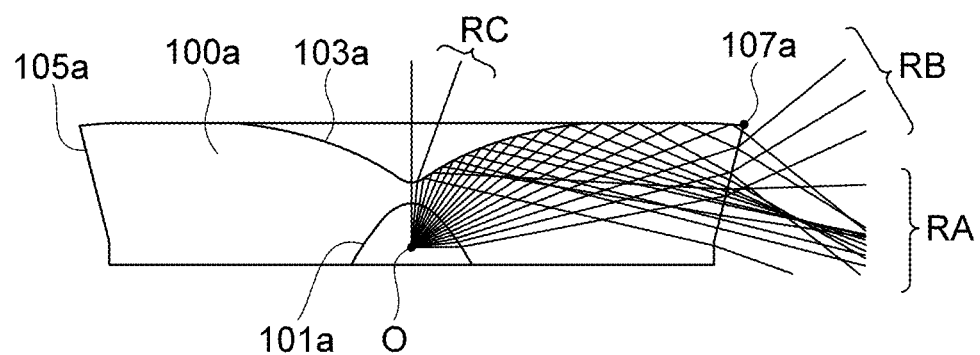
FIG. 10 shows optical paths of rays through a lens of Comparative Example 1 which corresponds to Example 1.

FIG. 10 shows optical paths of rays through a lens 100a of Comparative Example 1, which corresponds to Example 1. A light receiving surface 101a of the lens 100a is shaped like a dome, the top of which is located at a point of intersection with the optical axis. Inclination of the light receiving surface 101a with respect to the plane containing the emitting surface is larger than that of the light receiving surface 101A of Example 1 with respect to the plane containing the emitting surface. Shapes of a reflecting surface 103a and a light exit surface 105a are identical with those of the reflecting surface 103A and the light exit surface 105A of Example 1.

In a coordinate system in which the point O is set to the origin and the optical axis is set to Z-axis, the light receiving surface 101a and the reflecting surface 103a can be represented by Expression (6) when a distance from the Z-axis is designated as r.

Table 2 shows coefficients of Expression (6). In Table 2, "E-03" represents $10^{-3}$.

TABLE 2

| Coefficient | Light receiving surface 101a | Reflecting surface 103a |
|---|---|---|
| C | −1.000 | 0.000 |
| K | −1.000 | 0.000 |
| A0 | 1.400 | 2.100 |
| A1 | 0.000 | 0.600 |
| A2 | 0.000 | −0.055 |
| A3 | 0.000 | 1.45E−03 |
| A4 | 0.000 | 0.000 |

A light exit surface 105a is of cone, a diameter of which is 10.0 at z=0.1 and 11.0 at z=4.0.

In FIG. 10, RA represents rays which are emitted from the point O, reflected by the reflecting surface 103a and made to exit from the light exit surface 105a. RB represents rays which are emitted from the point O at small angles α and made to exit directly from the light exit surface 105a without being reflected on the reflecting surface 103a. RB exist because inclination of the light receiving surface 101a with respect to the plane containing the emitting surface is larger than that of the light receiving surface 101A of Example 1 with respect to the plane containing the emitting surface. RC represents rays around the optical axis which are emitted from the point O at large angles α and made to exit from the reflecting surface 103a.

Figure 12:
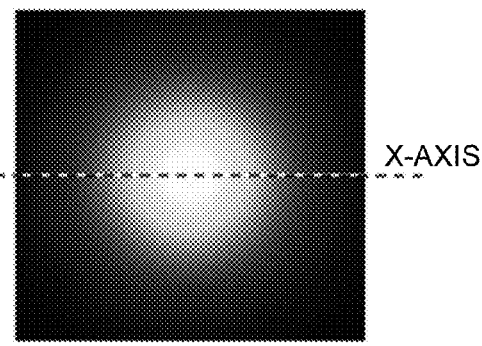
FIG. 12 shows illuminance on a plane to be illuminated in the case that the lens of Example 1 is used for illumination.

FIG. 12 shows illuminance on a plane to be illuminated in the case that the lens of Example 1 is used for illumination.

Figure 13:
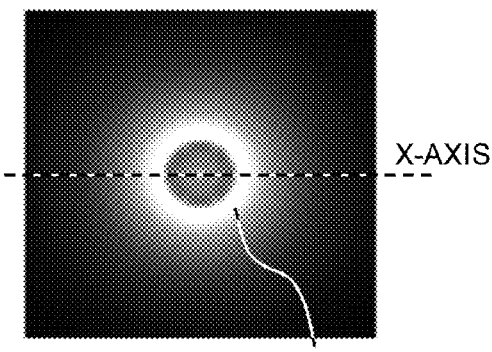
FIG. 13 shows illuminance on a plane to be illuminated in the case that the lens of Comparative Example 1 is used for illumination.

FIG. 13 shows illuminance on a plane to be illuminated in the case that the lens of Comparative Example 1 is used for illumination. In FIG. 13, a highly illuminated portion in the form of a ring, that is, unevenness of illuminance which cannot be observed in FIG. 12 is observed. Such unevenness of illuminance is generated by RB shown in FIG. 10, that is, rays which are emitted from the point O at small angles α and made to exit from the light exit surface 105a without being reflected on the reflecting surface 103a.

Figure 14:
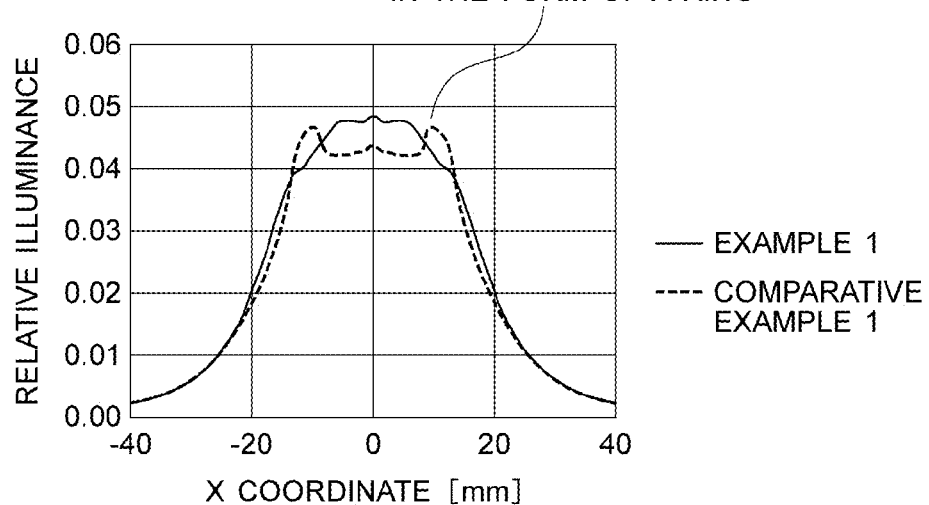
FIG. 14 shows a distribution of relative illuminance in X-axis direction concerning FIG. 12 and that of relative illuminance in X-axis direction concerning FIG. 13.

FIG. 14 shows a distribution of relative illuminance in X-axis direction concerning FIG. 12 and that of relative illuminance in X-axis direction concerning FIG. 13. The distribution of Comparative Example 1 shows the highly illuminated portion in the form of a ring, that is, unevenness of illuminance.

Figure 6:
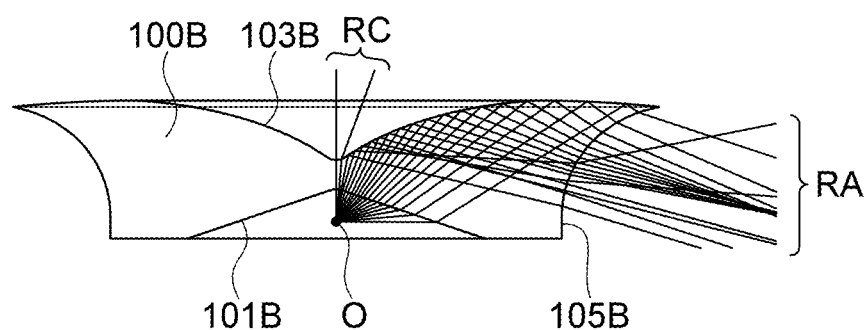
FIG. 6 shows optical paths of rays through a lens of Example 2 of the present invention.

FIG. 6 shows optical paths of rays through a lens 100B of Example 2 of the present invention. A light receiving surface 101B of the lens 100 B is substantially shaped like a cone, the top of which is located at a point of intersection with the optical axis. A reflecting surface 103B is shaped as a concave portion, the bottom of which is located at a point of intersection with the optical axis. The reflecting surface 103B is represented as a curve which is curved upward in a cross section containing the optical axis. A light exit surface 105B is inclined toward the outside. The light exit surface 105B is represented as a curve which is curved inward in a cross section containing the optical axis.

In a coordinate system in which the point O is set to the origin and the optical axis is set to Z-axis, the light receiving surface 101B and the reflecting surface 103B can be represented by Expression (6) when a distance from the Z-axis is designated as r.

Table 3 shows coefficients of Expression (6). In Table 3, "E−03" represents $10^{-3}$.

TABLE 3

| Coefficient | Light receiving surface 101B | Reflecting surface 103B |
|---|---|---|
| C | −2.000 | 0.000 |
| k | −10.00 | 0.000 |
| A0 | 1.100 | 2.100 |
| A1 | 0.000 | 0.600 |
| A2 | 0.000 | −0.055 |
| A3 | 0.000 | 1.45E−03 |
| A4 | 0.000 | 0.000 |

A light exit surface 105B is a torus surface. The center of the torus is at the point on Z-axis at which z=0.1, the internal diameter is 3.8 and the rotation diameter is 11.5.

In FIG. 6, RA represents rays which are emitted from the point O, reflected by the reflecting surface 103B and made to exit from the light exit surface 105B. RC represents rays around the optical axis which are emitted from the point O at large angles α and made to exit from the reflecting surface 103B. Rays which are emitted from the point O at small angles α and made to exit directly from the light exit surface 105B without being reflected on the reflecting surface 103B do not exist.

Figure 7:
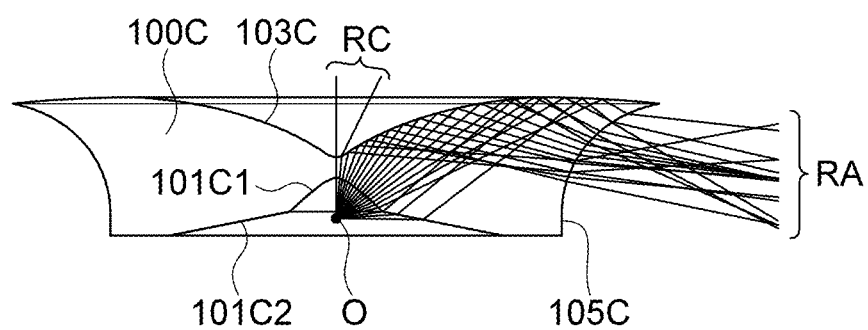
FIG. 7 shows optical paths of rays through a lens of Example 3 of the present invention.

FIG. 7 shows optical paths of rays through a lens 100C of Example 3 of the present invention. A light receiving surface 101C of the lens 100 C is shaped as a truncated cone with a top face, on which a dome is provided such that the top face forms the base of the dome. The central axis of the truncated cone and that of the dome are the optical axis. A reflecting surface 103C is shaped as a concave portion, the bottom of which is located at a point of intersection with the optical axis. In a cross section containing the optical axis, inclination of a curve which represents the side 101C1 of the dome with respect to the horizontal direction is larger than that of a curve which represents the side 101C2 of the truncated cone with respect to the horizontal direction. When inclination of the light receiving surface around the optical axis is increased, rays around the optical axis are largely refracted toward the side at the light receiving surface and therefore incident angles on the reflecting surface become smaller. Accordingly, depth of the concave portion forming the reflecting surface can be reduced. The reflecting surface 103C is represented as a curve which is curved upward in a cross section containing the optical axis. A light exit surface 105C is inclined toward the outside. The light exit surface 105C is represented as a curve which is curved inward in a cross section containing the optical axis.

In a coordinate system in which the point O is set to the origin and the optical axis is set to Z-axis, the light receiving surfaces 101C1, 101C2 and the reflecting surface 103C can be represented by Expression (6) when a distance from the Z-axis is designated as r.

Table 4 shows coefficients of Expression (6). In Table 4, "E−03" represents $10^{-3}$.

TABLE 4

| Coefficient | Light receiving surface 101C1 | Light receiving surface 101C2 | Reflecting surface 103C |
|---|---|---|---|
| C | −2.000 | −2.000 | 0.000 |
| K | −2.000 | −10.00 | 0.000 |
| A0 | 1.400 | 1.100 | 2.100 |
| A1 | 0.000 | 0.000 | 0.600 |
| A2 | 0.000 | 0.000 | −0.055 |
| A3 | 0.000 | 0.000 | 1.45E−03 |
| A4 | 0.000 | 0.000 | 0.000 |

A light exit surface 105C is a torus surface. The center of the torus is at the point on Z-axis at which z=0.1, the internal diameter is 3.8 and the rotation diameter is 11.5.

In FIG. 7, RA represents rays which are emitted from the point O, reflected by the reflecting surface 103C and made to exit from the light exit surface 105C. RC represents rays around the optical axis which are emitted from the point O at large angles α and made to exit from the reflecting surface 103C. Rays which are emitted from the point O at small angles α and made to exit directly from the light exit surface 105C without being reflected on the reflecting surface 103C do not exist.

Figure 8:
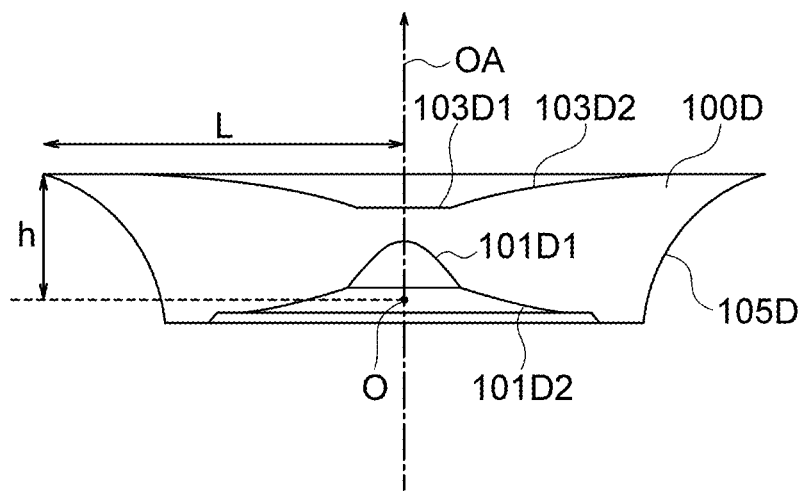
FIG. 8 shows a cross section containing the optical axis of a lens of Example 4 of the present invention.

FIG. 8 shows a cross section containing the optical axis of a lens 100D of Example 4 of the present invention. A light receiving surface 101D of the lens 100D is shaped as a truncated cone with a top face on which a dome is provided such that the top face forms the base of the dome. The central axis of the truncated cone and that of the dome are the optical axis. In a cross section containing the optical axis, inclination of a curve which represents the side 101D1 of the dome with respect to the horizontal direction is larger than that of a curve which represents the side 101D2 of the truncated cone with respect to the horizontal direction. A reflecting surface includes a flat reflecting surface 103D1 around the optical axis and a reflecting surface 103D2, which forms a concave portion with the reflecting surface 103D1 forming the bottom of the concave portion. The reflecting surface 103D2 is represented as a curve which is curved upward in a cross section containing the optical axis. The reflecting surface 103D1 is coated with a reflective paint. A light exit surface 105D is inclined toward the outside. The light exit surface 105D is represented as a curve which is curved inward in a cross section containing the optical axis.

In a coordinate system in which the point O is set to the origin and the optical axis is set to Z-axis, the light receiving surfaces 101D1, 101D2 and the reflecting surface 103D2 can be represented by Expression (6) when a distance from the Z-axis is designated as r.

Table 5 shows coefficients of Expression (6). In Table 5, "E-03" represents $10^{-3}$.

TABLE 5

| Coefficient | Light receiving surface 101D1 | Light receiving surface 101D2 | Reflecting surface 103D2 |
|---|---|---|---|
| C | 0.000 | 0.000 | 0.000 |
| K | 0.000 | 0.000 | 0.000 |
| A0 | 2.090 | 1.300 | 3.000 |
| A1 | 0.000 | −0.400 | 0.400 |
| A2 | −0.600 | 0.025 | −0.036 |
| A3 | 0.000 | 0.000 | 1.080E−03 |
| A4 | 0.040 | 0.000 | 0.000 |

A light exit surface 105D is a torus surface. The center of the torus is at the point on Z axis at which z=−0.36, the internal diameter is 5.2 and the rotation diameter is 12.5.

Figure 9:
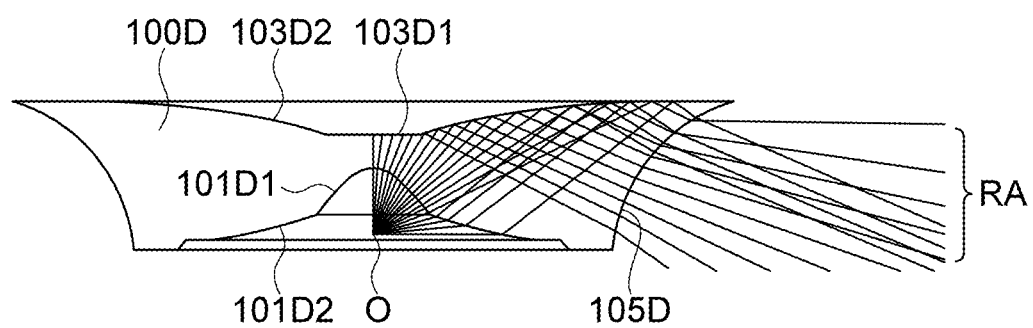
FIG. 9 shows optical paths of rays through the lens of Example 4 of the present invention.

FIG. 9 shows optical paths of rays through the lens 100D of Example 4 of the present invention. In FIG. 9, RA represents rays which are emitted from the point O, reflected by the reflecting surface 103D2 and made to exit from the light exit surface 105D. Rays which are emitted from the point O at small angles α and made to exit directly from the light exit surface 105D without being reflected on the reflecting surface 103D2 do not exist. Further, the reflective paint with which the flat portion 103D1 is coated prevents rays from exiting from the reflecting surface 103D1. A metal film or the like can be used for coating in place of the reflective paint.

Figure 11:
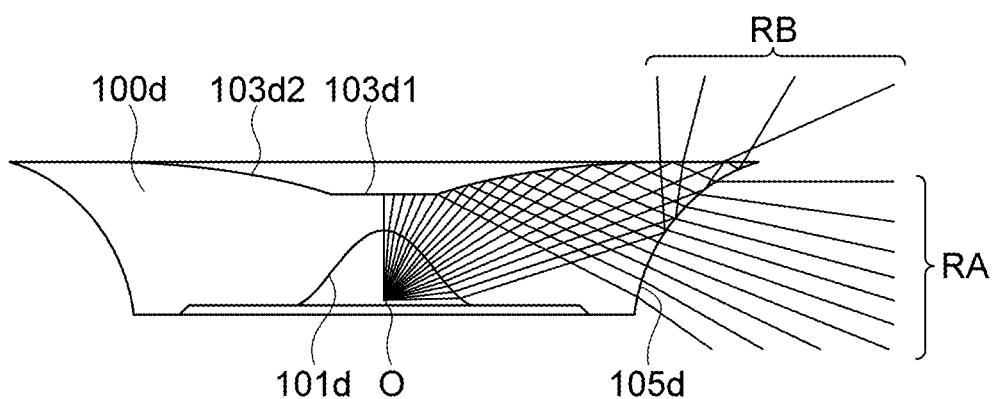
FIG. 11 shows optical paths of rays through a lens of Comparative Example 2 which corresponds to Example 4.

FIG. 11 shows optical paths of rays through a lens 100d of Comparative Example 2 which corresponds to Example 4. A light receiving surface 101d of the lens 100d is shaped like a dome, the top of which is located at a point of intersection with the optical axis. Inclination of the light receiving surface 101d with respect to the plane containing the emitting surface is larger than that of the light receiving surface 101D2 of Example 4 with respect to the plane containing the emitting surface. Shapes of a reflecting surface 103d and a light exit surface 105d are identical with those of the reflecting surface 103D and the light exit surface 105D of Example 4.

In a coordinate system in which the point O is set to the origin and the optical axis is set to Z axis, the light receiving surface 101d and the reflecting surface 103d2 can be represented by Expression (6) when a distance from the Z-axis is designated as r.

Table 6 shows coefficients of Expression (6). In Table 6 "E-03" represents $10^{-3}$.

TABLE 6

| Coefficient | Light receiving surface 101d | Reflecting surface 103d2 |
|---|---|---|
| C | 0.000 | 0.000 |
| K | 0.000 | 0.000 |
| A0 | 2.090 | 3.000 |
| A1 | −0.400 | 0.400 |
| A2 | 0.025 | −0.036 |
| A3 | 0.000 | 1.080E−03 |
| A4 | 0.000 | 0.000 |

A light exit surface 105d is a torus surface. The center of the torus is at the point on Z axis at which z=−0.36, the internal diameter is 5.2 and the rotation diameter is 12.5.

In FIG. 11, RA represents rays which are emitted from the point O, reflected by the reflecting surface 103d2 and made to exit from the light exit surface 105d. RB represents rays which are emitted from the point O at small angles α and exit directly from the light exit surface 105d without being reflected on the reflecting surface 103d2. RB exist because inclination of the light receiving surface 101d with respect to the plane containing the emitting surface is larger than that of the light receiving surface 101D2 of Example 4 with respect to the plane containing the emitting surface.

Table 7 shows parameters concerning shapes of the lenses of Examples 1 to 4 and Comparative Examples 1 and 2.

TABLE 7

| | Example 1 | Example 2 | Example e3 | Example 4 | Comparative Example 1 | Comparative Example 2 |
|---|---|---|---|---|---|---|
| L (mm) | 10.97 | 11.00 | 11.00 | 11.00 | 10.97 | 11.00 |
| h (mm) | 3.88 | 3.98 | 3.98 | 4.08 | 3.88 | 4.08 |
| Xp (mm) | 2.83 | 3.43 | 3.43 | 4.54 | 1.15 | 2.35 |

TABLE 7-continued

|  | Example 1 | Example 2 | Example e3 | Example 4 | Comparative Example 1 | Comparative Example 2 |
|---|---|---|---|---|---|---|
| tan θp | 3.02 | 3.00 | 3.00 | 5.78 | 0.44 | 1.33 |
| $\dfrac{n \sin \omega}{n \cos \omega - 1}$ | 1.86 | 2.17 | 2.17 | 3.06 | 1.42 | 1.83 |

As apparently shown in Table 7, Expression (3) described below is satisfied in Examples 1 to 4 while Expression (3) is not satisfied in Comparative Examples 1 and 2.

$$2.0 \cdot \left( \frac{n \sin \omega}{n \cos \omega - 1} \right) > \tan \theta_p > \frac{n \sin \omega}{n \cos \omega - 1} \quad (3)$$

Figure 15:
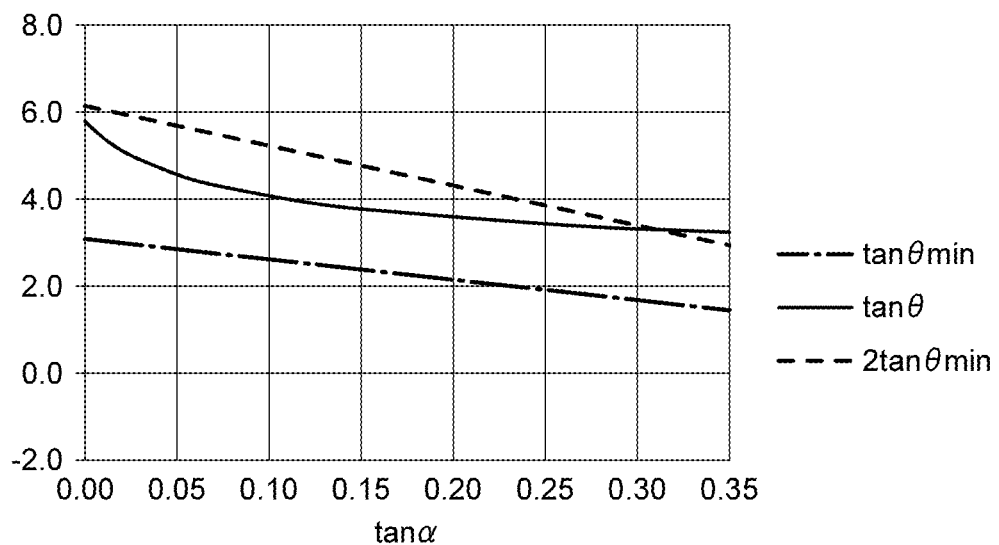
FIG. 15 shows a relationship between angle α and angles θ and θ min in Expression (5) concerning the light receiving surface of the lens of Example 4.

FIG. 15 shows a relationship between angle α and angles θ and θ min concerning the light receiving surface 101D2 of the lens of Example 4. As apparently shown in FIG. 15, Expression (5) is satisfied in the range of $$\tan \alpha < 0.2$$

concerning the light receiving surface 101D2 of the lens of Example 4.

Figure 16:
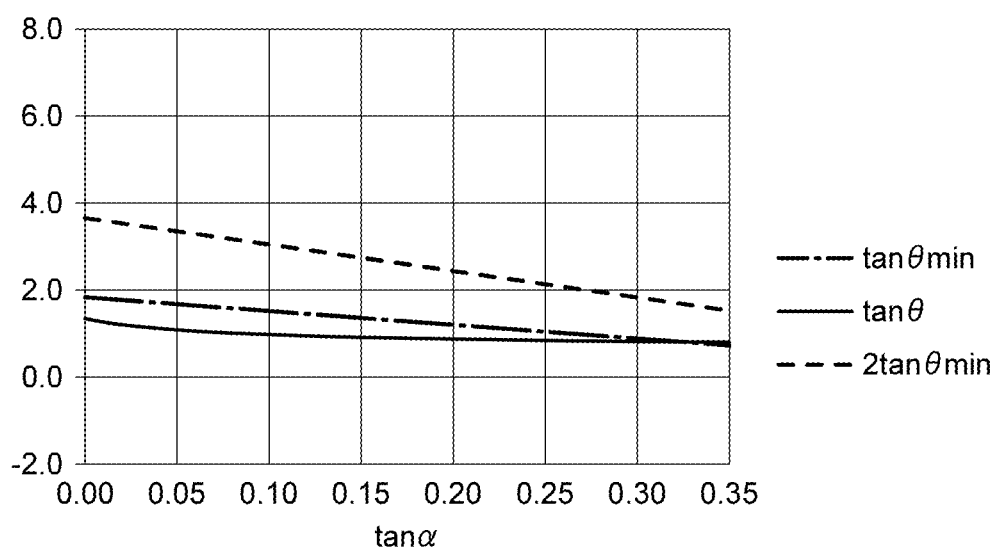
FIG. 16 shows a relationship between angle α and angles θ and θ min in Expression (5) concerning the light receiving surface of the lens of Comparative Example 2.

FIG. 16 shows a relationship between angle α and angles θ and θ min in Expression (5) concerning the light receiving surface 101d of the lens of Comparative Example 2. As apparently shown in FIG. 16, Expression (5) is not satisfied concerning the light receiving surface 101d of the lens of Comparative Example 2.

Thus, if the light receiving surface of a lens is constructed such that Expression (5) is satisfied when angle α is small, rays which are emitted at small angles α and made to exit directly from the light exit surface without being reflected on the reflecting surface can be eliminated.

Figure 17:
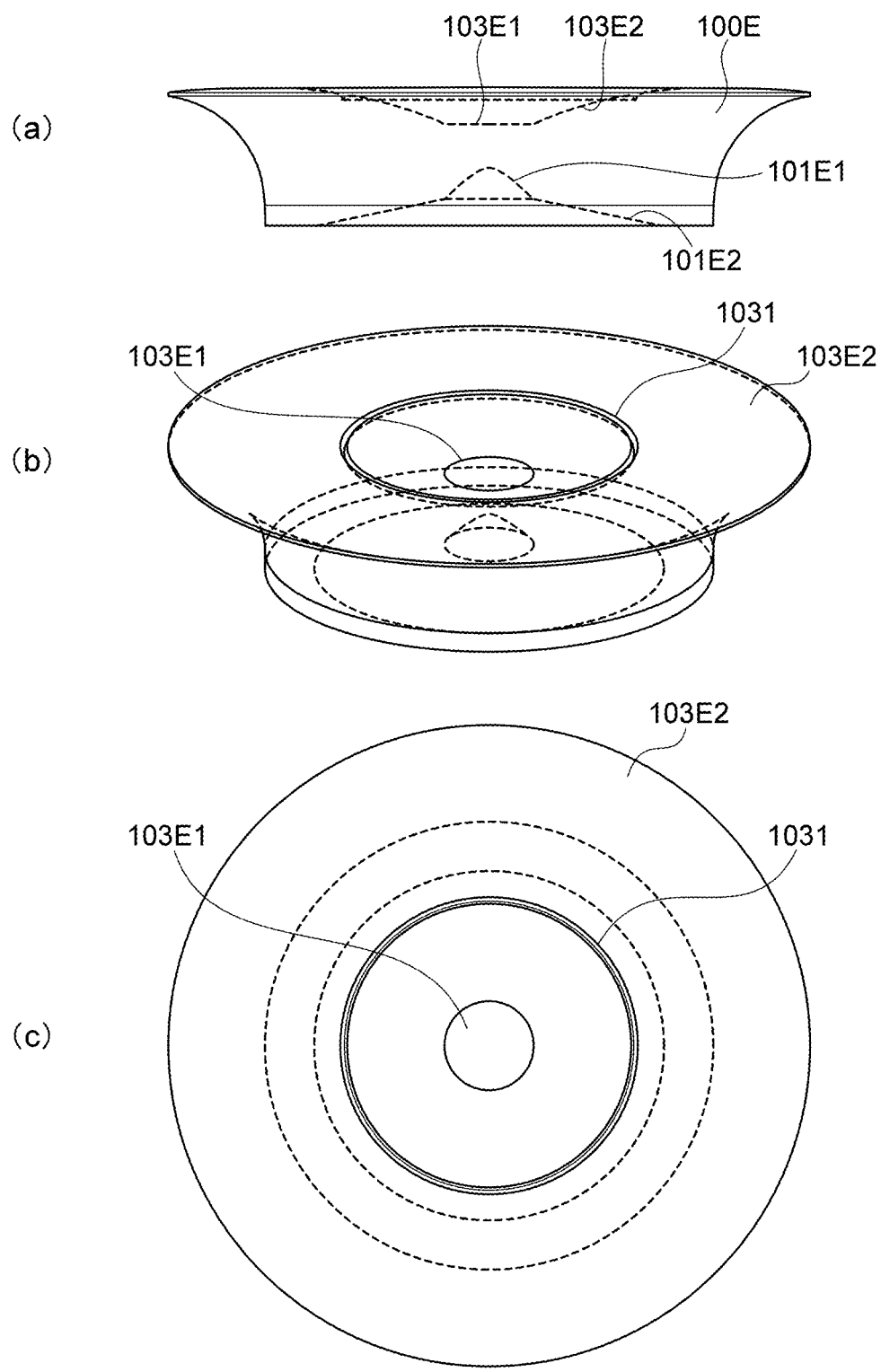
FIG. 17 shows a structure of a lens of Example 5 of the present invention.

FIG. 17 shows a structure of a lens 100E of Example 5 of the present invention. FIG. 17(a) shows a cross section containing the optical axis of the lens 100E. FIG. 17(b) shows a perspective view of the lens 100E. FIG. 17(c) shows a top view of the lens 100E. The lens 100E is substantially identical in shape with the lens 100D of Example 4 except for the following point. That is, the lens 100E differs from the lens 100D in a v-groove 1031 which is provided at a certain distance from the optical axis on a reflecting surface 103E2. In the lens 100D, few rays pass through the reflecting surfaces 103D1 and 103D2, and therefore it sometimes causes a lower illuminance at a portion immediately above the lens on the plane to be illuminated. In such a case, the v-groove 1031 is provided to make some of lights from the light source pass through the surface such that illuminance at the portion immediately above the lens is enhanced. By way of example, width of the v-groove 1031 is 0.2 millimeters, depth is 0.3 millimeters and the distance from the optical axis is 5 millimeters. A plurality of v-grooves can be concentrically provided around the optical axis.

Figure 18:
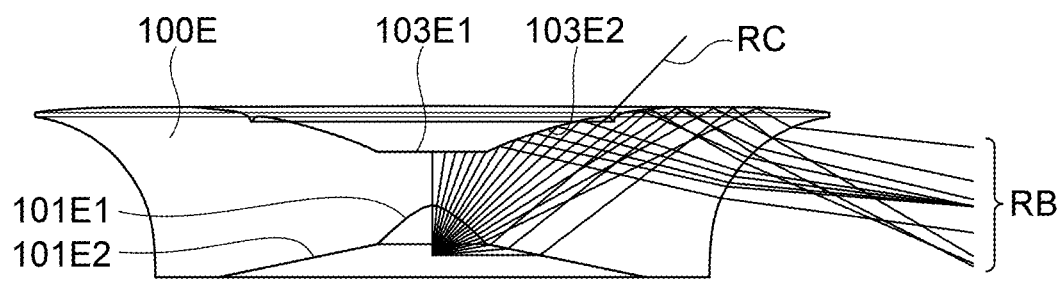
FIG. 18 shows optical paths of rays through the lens of Example 5 of the present invention.

FIG. 18 shows optical paths of rays through the lens 100E of Example 5 of the present invention. The optical paths of rays through the lens 100E are substantially identical with those of the lens 100D of Example 4 except for the following point. That is, rays RC which pass through the v-groove 1031 and travel to the portion immediately above the lens 100e exist.

Figure 19:
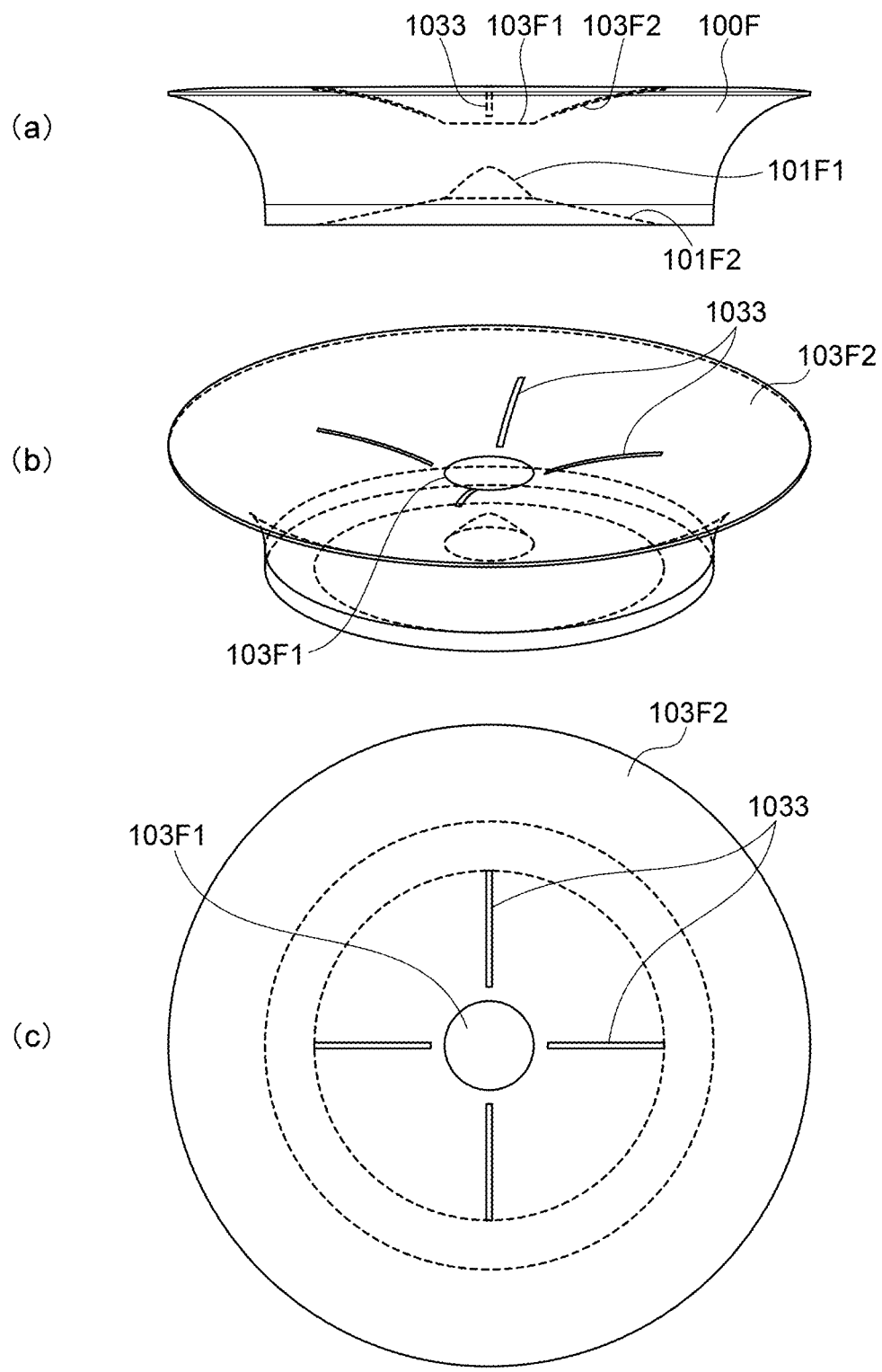
FIG. 19 shows a structure of a lens of Example 6 of the present invention.

FIG. 19 shows a structure of a lens 100F of Example 6 of the present invention. FIG. 19(a) shows a cross section containing the optical axis of the lens 100F. FIG. 19(b) shows a perspective view of the lens 100F. FIG. 19(c) shows a top view of the lens 100F. The lens 100F is substantially identical in shape with the lens 100D of Example 4 except for the following point. That is, the lens 100F differs from the lens 100D in areas 1033 with fine asperities which are radially arranged on a reflecting surface 103F2. Like the case of Example 5, the areas 1033 are provided to make some of lights from the light source to pass through the surface such that illuminance at the portion immediately above the lens is enhanced. By way of example, the areas 1033 extend in a range in which distance from the optical axis is 2 millimeters to 6 millimeters and the width is 0.2 millimeters. The fine asperities can be formed by blasting. In such cases, size of the asperities is several micrometers to several tens of micrometers.

What is claimed is:

1. An optical element comprising a light receiving surface which is designed to cover an emitting surface of a planar light source device, a reflecting surface which is arranged opposed to the light receiving surface, and a light exit surface which is contiguous to the periphery of the reflecting surface, wherein the light receiving surface is separate from the reflecting surface, wherein when the center of the emitting surface is designated as a point O and an axis which passes through the point O and is perpendicular to the emitting surface is designated as an optical axis of the optical element, the reflecting surface has a concave portion around the optical axis and an outer edge surrounding the concave portion and wherein in any cross section of the optical element, which contains the optical axis and is perpendicular to the emitting surface, lights emitted from the point O are refracted when passing through the light receiving surface, reflected on an area of 80% or more of the reflecting surface, and exit from the light exit surface, and when an inclination angle which a normal to the light receiving surface at a point P forms with a first plane which contains the emitting surface is designated as θp, θp being measured counterclockwise with respect to the first plane, the point P being a point of intersection of the light receiving surface with the first plane, an inclination angle which a line connecting the point P and a point of intersection of the reflecting surface with the light exit surface forms with the first plane is designated as ω and refractive index of a material of the optical element is designated as n, inclination of the light receiving surface with respect to the first plane is determined so as to satisfy the following expressions, where the unit of angles is degree $$2.0 \cdot \left( \frac{n \sin \omega}{n \cos \omega - 1} \right) > \tan \theta_p > \frac{n \sin \omega}{n \cos \omega - 1} \quad (3)$$

$$\cos \omega > 1/n \quad (2).$$

2. The optical element according to claim 1, wherein in any cross section of the optical element, which contains the optical axis and is perpendicular to the emitting surface, when a point of intersection of a line which passes through the point O and forms an inclination angle of α with respect to the first plane, with the light receiving surface is designated as a point Q and an inclination angle of a normal to the light receiving surface at the point Q with respect to the first plane is designated as θ, inclination of the light receiving surface with respect to the first plane is determined so as to satisfy the following expression in a range of $$\tan\alpha < 0.2. \tag{4}$$
$$\tan\theta > \frac{n\sin\omega - \sin\alpha}{n\cos\omega - \cos\alpha}.$$

3. The optical element according to claim 2, wherein inclination of the light receiving surface with respect to the first plane is determined so as to satisfy the following expression in a range of $$\tan\alpha < 0.2. \tag{5}$$
$$2.0 \cdot \left(\frac{n\sin\omega - \sin\alpha}{n\cos\omega - \cos\alpha}\right) > \tan\theta > \frac{n\sin\omega - \sin\alpha}{n\cos\omega - \cos\alpha}.$$

4. The optical element according to claim 1, wherein the light exit surface is constructed such that distance from the optical axis increases with distance from the first plane and in any cross section of the optical element, which contains the optical axis and is perpendicular to the emitting surface, the light exit surface is represented as a curve which is curved inward.

5. The optical element according to claim 1, comprising a reflection member in an area containing a point of intersection of the reflecting surface with the optical axis.

6. An illumination unit comprising a planar light source device and the optical element according to claim 1 used for the planar light source device, wherein the unit is constructed such that lights which exit from the light exit surface of the optical element are reflected toward the front.

7. An optical element comprising a light receiving surface which is designed to cover an emitting surface of a planar light source device, a reflecting surface which is arranged opposed to the light receiving surface, a light exit surface which is contiguous to the periphery of the reflecting surface,
wherein when the center of the emitting surface is designated as a point O and an axis which passes through the point O and is perpendicular to the emitting surface is designated as an optical axis of the optical element, the reflecting surface has a concave portion around the optical axis and an outer edge surrounding the concave portion and
wherein in any cross section of the optical element, which contains the optical axis and is perpendicular to the emitting surface, lights emitted from the point O are refracted when passing through the light receiving surface, reflected on an area of 80% or more of the reflecting surface, and exit from the light exit surface, and when an inclination angle which a normal to the light receiving surface at a point P forms with a first plane which contains the emitting surface is designated as θp, θp being measured counterclockwise with respect to the first plane, the point P being a point of intersection of the light receiving surface with the first plane, an inclination angle which a line connecting the point P and a point of intersection of the reflecting surface with the light exit surface forms with the first plane is designated as w and refractive index of a material of the optical element is designated as n, inclination of the light receiving surface with respect to the first plane is determined so as to satisfy the following expressions such that a ray emitted from the point O in the direction perpendicular to the optical axis is refracted at the point P, and then travels on the side of the optical axis with respect to the line connecting the point P and the point representing the outer edge of the reflecting surface, where the unit of angles is degree $$\tan\theta_p > \frac{n\sin\omega}{[n\cos\omega] - 1} \tag{1}$$
$$\cos\omega > \frac{1}{n}. \tag{2}$$

* * * * *